US008584020B2

(12) United States Patent
Kishore et al.

(10) Patent No.: US 8,584,020 B2
(45) Date of Patent: Nov. 12, 2013

(54) USER-DEFINED APPLICATION MODELS

(75) Inventors: Ajitesh Kishore, Kirkland, WA (US);
Brian Meek, Redmond, WA (US);
Christopher Hugh Pratley, Seattle, WA
(US); Alexander G. Gounares,
Kirkland, WA (US); **Lewis Charles
Levin**, Seattle, WA (US)

(73) Assignee: Microsoft Corporation, Redmond, WA
(US)

( * ) Notice: Subject to any disclaimer, the term of this
patent is extended or adjusted under 35
U.S.C. 154(b) by 1688 days.

(21) Appl. No.: 11/966,935

(22) Filed: Dec. 28, 2007

(65) Prior Publication Data

US 2009/0171649 A1 Jul. 2, 2009

(51) Int. Cl.
*G06F 3/00* (2006.01)
(52) U.S. Cl.
USPC .............. 715/751; 715/759; 715/760
(58) Field of Classification Search
USPC .............. 715/751, 733, 744, 759, 760
See application file for complete search history.

(56) References Cited

U.S. PATENT DOCUMENTS

| 6,377,965 B1 | 4/2002 | Hachamovitch et al. |
| 6,766,069 B1 | 7/2004 | Dance et al. |
| 6,996,800 B2 | 2/2006 | Lucassen et al. |
| 7,224,989 B2 | 5/2007 | Kraft |
| 2001/0017632 A1* | 8/2001 | Goren-Bar ............. 345/744 |
| 2003/0069944 A1* | 4/2003 | Barlock et al. .......... 709/220 |
| 2004/0230903 A1 | 11/2004 | Elza et al. |
| 2005/0119960 A1 | 6/2005 | Martin et al. |
| 2006/0074652 A1 | 4/2006 | Ativanichayaphong et al. |
| 2006/0218476 A1 | 9/2006 | Gombert |
| 2006/0256139 A1 | 11/2006 | Gikandi |
| 2007/0016650 A1 | 1/2007 | Gilbert et al. |
| 2007/0208751 A1* | 9/2007 | Cowan et al. ............ 707/10 |
| 2007/0244906 A1* | 10/2007 | Colton et al. ............ 707/10 |

OTHER PUBLICATIONS

Michael Angeles. Using a Wiki for Documentation and Collaborative Authoring. Orinally published Nov. 28, 2004, LLRX.com.http://urlgreyhot.com/personal/publications/using_a_wiki_for_documentation_and_collaborative_authoring. Last accessed Aug. 21, 2007, 5 pages.

William Emigh, et al. Collaborative Authoring on the Web: A Genre Analysis of Online Encyclopedias. Proceedings of the 38th Hawaii International Conference on System Sciences—2005. 0-7695-2268-8/05, IEEE. http://csdl2.computer.org/comp/proceedings/hicss/2005/2268/04/22680099a.pdf. Last accessed Aug. 21, 2007, 11 pages.

* cited by examiner

*Primary Examiner* — Omar Abdul-Ali
(74) *Attorney, Agent, or Firm* — Lee & Hayes, PLLC

(57) ABSTRACT

A system (and corresponding method) that employs wiki-type models to consider authoring rather than composition in an application environment is provided. The innovation enables collaborative information and templates to be used to enhance quality, productivity, etc. within a software application environment. These wiki-type models can provide features, functions and benefits related to, but not limited to, general information, auto-fills, formats, schema, conversions, preferences, etc.

12 Claims, 10 Drawing Sheets

USER-DEFINED APPLICATION MODELS

BACKGROUND

Technological advances in the computing space are constantly being developed to provide users with a vast array of tools to enhance business productivity, information access and communications. For example, user-regulated Internet-based information sources continue to evolve within the Internet community. By way of specific example, many of these web-based encyclopedia or information sources enable users to collaboratively develop and share information by updating records and providing information that was otherwise not easily accessible. Today, these collaborative information sources are available in many different areas including, encyclopedia-type information, travel-based information, and product rating information.

The Internet and the World Wide Web continues to evolve rapidly with respect to both volume of information and number of users. As will be understood, the Internet is a collection of interconnected computer networks accessible by anyone with an Internet connection. The World Wide Web, or simply the web, is a service that connects numerous Internet accessible sites via hyperlinks and uniform resource locators (URLs). As a whole, the web provides a global space for accumulation, exchange and dissemination of information. Further, the number of users continues to increase as more and more pertinent information becomes accessible over the web.

To date, one particular user-regulated online information site has approximately 8.5 million articles in 253 languages, comprising a combined total of over 1.4 billion words for all related sites. The English language edition of this site passed the 2 million article mark in early September, 2007, and as of October, 2007, it had over 2.05 million articles consisting of over 890 million words. The articles within these sites are most often written collaboratively by volunteers around the world. As well, the vast majority of them can be edited by anyone with access to the Internet.

As the popularity of these user-collaborative sites continues to grow, they have been dubbed as the 'wiki-model.' The word 'wiki' refers to the collaborative website structure. In other words, a 'wiki' often refers to computer software that allows users to easily create, edit, and link web pages. Conventionally, 'wikis' were often used to create collaborative websites, power community websites, and were increasingly being installed by businesses to provide affordable and effective Intranets or for use in knowledge management.

SUMMARY

The following presents a simplified summary of the innovation in order to provide a basic understanding of some aspects of the innovation. This summary is not an extensive overview of the innovation. It is not intended to identify key/critical elements of the innovation or to delineate the scope of the innovation. Its sole purpose is to present some concepts of the innovation in a simplified form as a prelude to the more detailed description that is presented later.

The innovation disclosed and claimed herein, in one aspect thereof, comprises a system that employs wiki-type models in an application environment. More particularly, the innovation enables collaborative information and templates to be used to enhance quality, productivity, etc. within a software application environment. These wiki-type models can provide features, functions and benefits related to, but not limited to, general information, auto-fills, formats, schema, conversions, preferences, etc.

In accordance with aspects, various wiki-models can be provided to help manage complex data storage problems and processing. In one aspect, a personalized language model can provide predictive texting, auto filling capabilities, auto speech generation, and hand writing assistance. For instance, as most users have different styles of recording information, these language models for generating predicative text can employ auto filling some text based upon a prediction from past actions, etc.

In yet other aspects, the innovation employs iterative wiki-models which consider authoring versus composition including contextual recognition, e.g., provide a particular audience a four line summary versus complete detail to another audience. This automated intelligence can be based upon a predefined or inferred preference. Essentially, the innovation can adapt data output based upon audience context, automatically craft data from the user's or audience point of view, adapt interfaces based on the user's or audience point of view, generating auto summaries, etc.

Still other aspects employ multi-modularity generation. Here, multi-modularity generation includes converting video into audio into text and so forth. Thus, a user can author something once and the system can automatically convert the data into other modalities as a function of user context. Authoring of wiki-style data and information includes collaborative creation and authoring of documents via wiki-type models, versioning of data over time as different people contribute, time stamping and management of data according to time.

In yet another aspect thereof, a machine learning and reasoning component is provided that employs a probabilistic and/or statistical-based analysis to prognose or infer an action that a user desires to be automatically performed.

To the accomplishment of the foregoing and related ends, certain illustrative aspects of the innovation are described herein in connection with the following description and the annexed drawings. These aspects are indicative, however, of but a few of the various ways in which the principles of the innovation can be employed and the subject innovation is intended to include all such aspects and their equivalents. Other advantages and novel features of the innovation will become apparent from the following detailed description of the innovation when considered in conjunction with the drawings.

DETAILED DESCRIPTION

Figure 1:
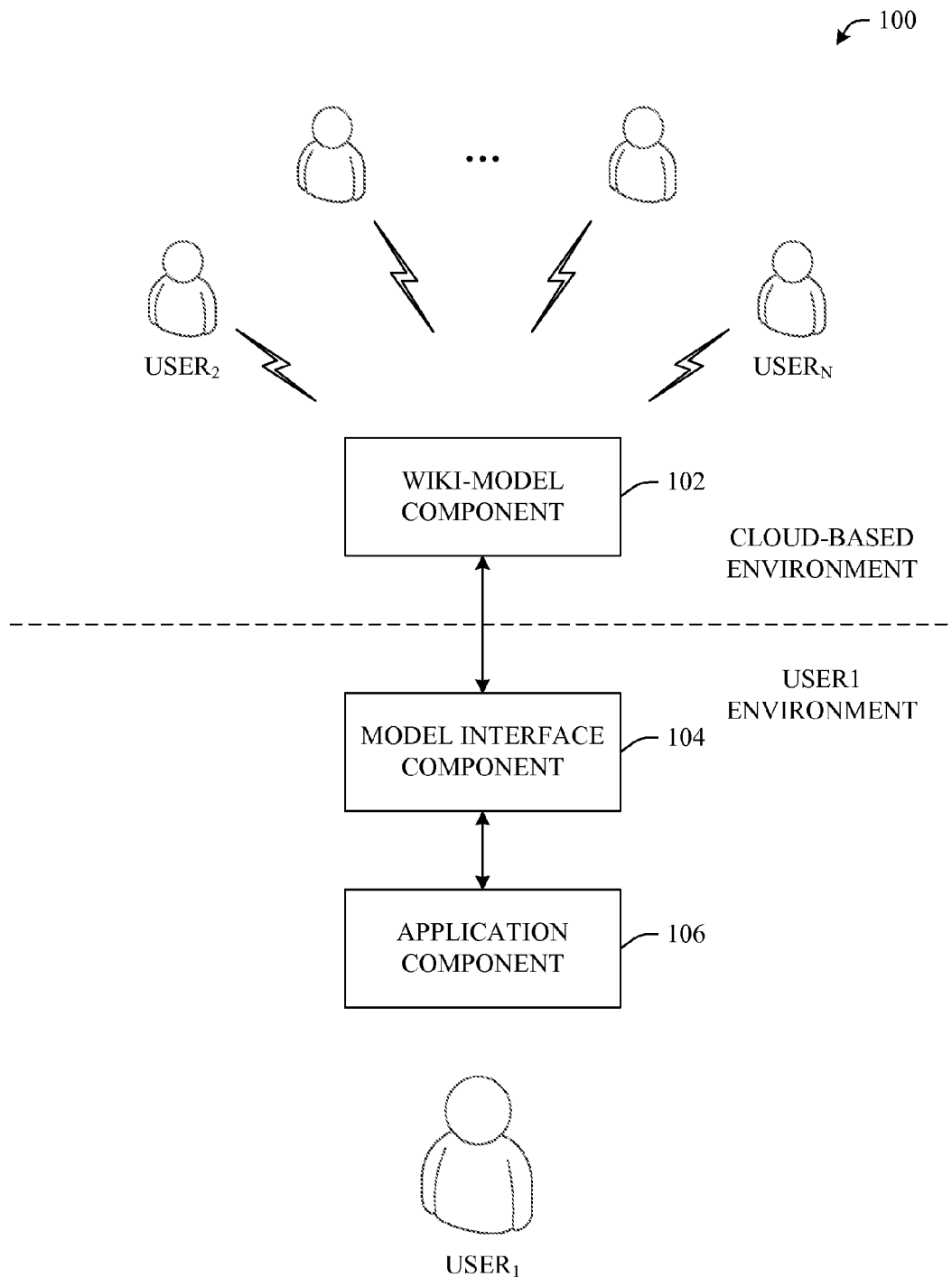
FIG. 1 illustrates an example system that enables wiki-type application models to be used in connection with traditional software applications.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

As used in this application, the terms "component" and "system" are intended to refer to a computer-related entity, either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution, and a component can be localized on one computer and/or distributed between two or more computers.

As used herein, the term to "infer" or "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

Referring initially to the drawings, FIG. 1 illustrates a system 100 that enables 'community models' or 'personalized models' to be used in connection with traditional software applications in an effort to enhance productivity and improve consistency. Generally, the system 100 can include a wiki-model component 102 that can define or configure data by way of a model interface component 104 to an application component 106. In other words, the wiki-model component 102 can employ data suggestions, auto-fill texts, manipulation, conversion, etc.—all of which can be based upon a user action, preference, policy or context.

In one example, a wiki-model component 102 can be employed in connection with a word processing document. While this example (as well as other examples) is provided merely to add perspective to the innovation, it is to be understood that the examples are countless. Thus, other examples exist that are to be considered a part of this innovation and claims appended hereto.

Continuing with the example word processing aspect, in operation, the model interface component 104 can monitor a user's action(s) and thereafter determine (e.g., based upon rules, preference or policy) or infer (e.g., based upon learned feedback) what a user is doing or what a user would like to do. Still further, the system 100 can determine or infer how best to configure or format data based upon a wiki-model component 102.

By way of more particular example, suppose the user is preparing a summary of a coding project, here, the system can determine that this is what the user is doing. Accordingly, the system can suggest text, auto-fill text, etc. as well as automatically configure the document in a format suitable for a coding summary. Still further, the system can dynamically determine an intended audience for the document and thereafter employ rules, policies, preference or inferred knowledge to format in accordance with the intended recipient's preferences.

These features can be made available by way of the wiki-model component 102. In this example, a wiki-model component 102 can be employed to determine how best to configure a coding summary. The same or a disparate model can be used to auto-fill or suggest text while yet another model can be employed to configure the document in accordance with a target recipient's preference. For instance, if a target recipient is not interested in a detailed summer but rather a very high level, this recipient can establish a wiki-model which sets forth this preference. Accordingly, the system can dynamically access this preference and thereafter instruct the author accordingly. Thus, the innovation can be described as a focus on authorship rather than composition.

In accordance with the innovation, various models 102 can be provided to assist in management of complex data processing and storage. For example, as described supra, the wiki-model can provide a personalized language model that enables predictive texting, auto-filling capabilities, auto speech generation, hand writing assistance, etc. It will be understood that many users have personalized preferences and therefore different styles of recording information, thus language models 102 for generating predicative text can include auto-filling some text based upon predictions from past actions.

In accordance with the innovation, an iterative wiki-model 102 considers authoring versus composition including contextual recognition, e.g., provide a particular target user a four line summary versus someone else who needs more detail. As illustrated, wiki-model component(s) 102 can be created, modified, accessed or deleted by 1 to N users, where N is an integer. Moreover, as illustrated by the dashed line of FIG. 1, the wiki-model component 102 can be retained within a cloud-based environment (e.g., Internet). However, it is to be understood that the wiki-model component 102 or other wiki-model components 102' can be maintained locally (e.g., $USER_1$ Environment) without departing from the spirit and/or scope of the innovation and claims appended hereto.

The system 100 (e.g., via wiki-model component 102) can enable adaptation of data output depending on audience context, crafting data from the consumer's (or user's) point of view, adapting interfaces based on consumer's (user's) point of view, generating auto summaries, etc. Multi-modularity generation can be incorporated into wiki-model component 102 which includes conversion of one modality into another, e.g., video into audio into text and so forth. In other words, the innovation enables a user to author something once and then have it automatically converted into other modalities for use as appropriate.

It will be understood that the spontaneous authoring tools (e.g., functionality of the wiki-model component 102) can lower production costs for generating a document and lower transaction costs for sharing documents. Authoring wiki style includes collaborative creation and authoring of documents via wiki models 102, versioning of data over time as different people contribute, time stamping and management of data according to time.

Figure 2:
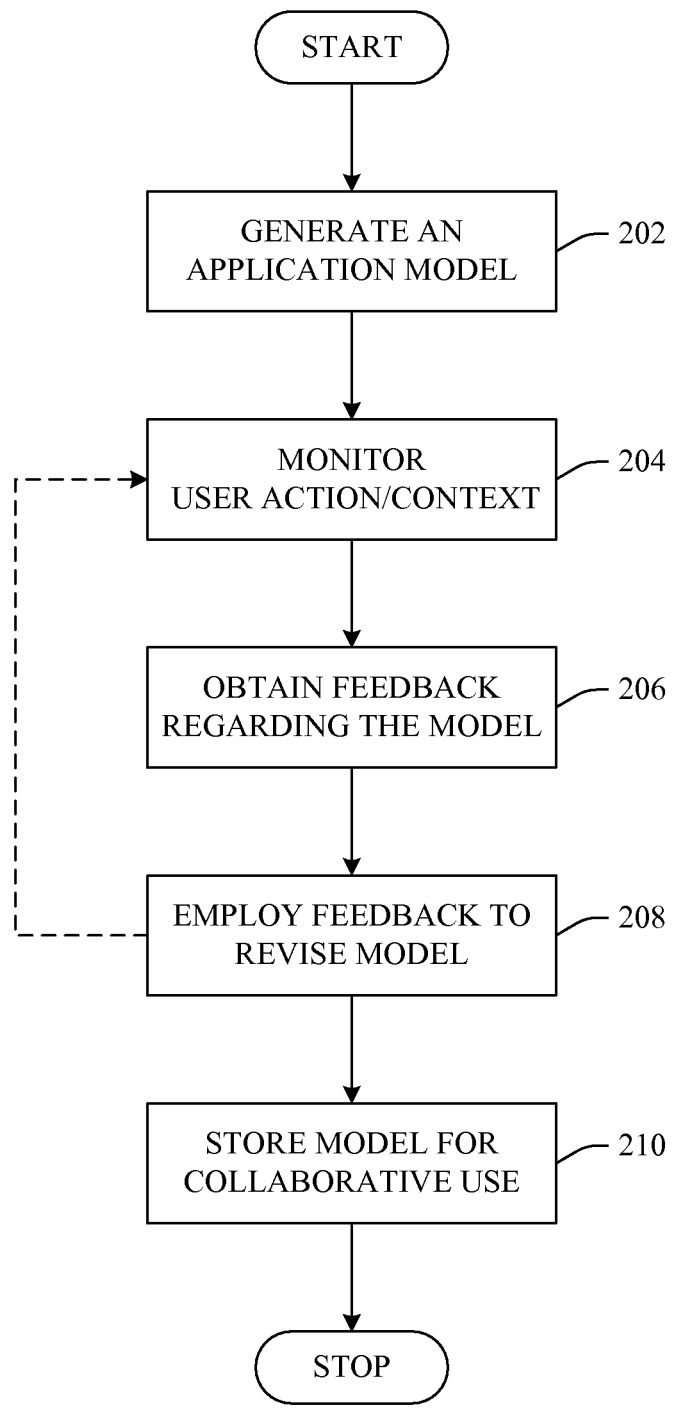
FIG. 2 illustrates an example flow chart of procedures that facilitate establishing a wiki-type application model in accordance with an aspect of the innovation.

FIG. 2 illustrates a methodology of establishing an application data model in accordance with an aspect of the innovation. As described above, the innovation enables wiki-style models to be established by a user (or group of users). These models can be used to manipulate or generate data based upon a user preference and/or context.

While, for purposes of simplicity of explanation, the one or more methodologies shown herein, e.g., in the form of a flow chart, are shown and described as a series of acts, it is to be understood and appreciated that the subject innovation is not limited by the order of acts, as some acts may, in accordance with the innovation, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation.

At 202, an application model can be generated, for example, a model that defines a format or layout for a particular document type. Similarly, the model can include preferences of a user with regard to a particular document type. Still further, contextual factors such as user identity, role, location, time of day, engaged activity, etc. can be incorporated into the model to further define criteria upon which the model is applicable.

At 204, user actions and/or context can be monitored in an effort to further refine the model generated at 202. Here, at 206, feedback can be obtained from the act of monitoring. This feedback can be employed at 208 in order to revise or further refine the model. As illustrated by the dashed line in FIG. 2, it is to be understood that the learning process of employing feedback to refine the model can be a recursive and on-going process.

At 210, the model can be stored for accessibility as desired or appropriate. For instance, as illustrated in FIG. 1, the model can be maintained within a cloud-based environment for use. In aspects, the model can be shared and collaboratively generated/refined based upon input/feedback from most any number of users. In other aspects, the model can be personalized to a user or group of users (e.g., organization, enterprise . . . ). Still further, the model can be maintained locally or distributed between a variety of locations (e.g., cloud-based, server-based, local . . . ).

Figure 3:
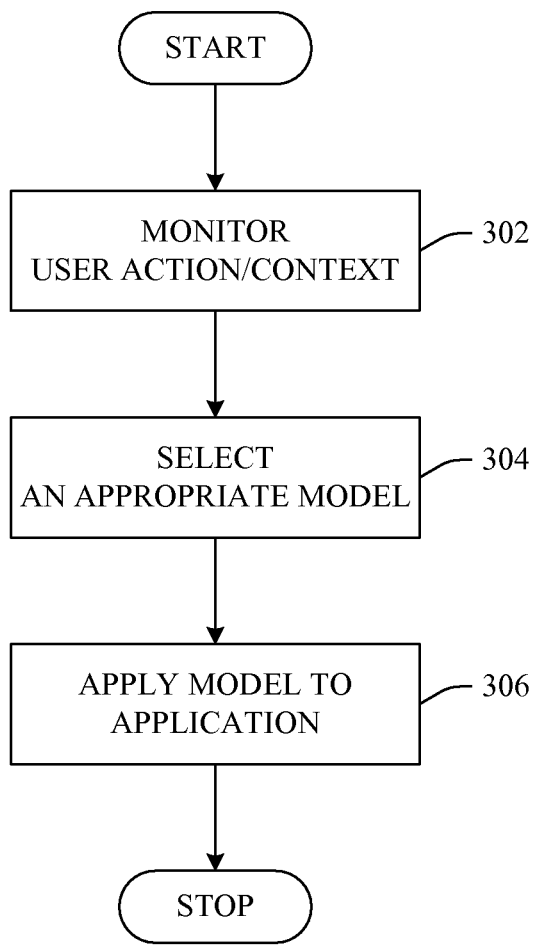
FIG. 3 illustrates an example flow chart of procedures that facilitates employing a wiki-type application model in accordance with an aspect of the innovation.

Referring now to FIG. 3, there is illustrated a methodology of employing an application model in accordance with the innovation. As described above, it is to be understood that the application model features, functions and benefits can be applied to most any applications without departing from the spirit and/or scope of this specification and claims appended hereto. By way of example, but not limitation, the application model can be applied to word processing applications, spreadsheet applications, presentation applications, communication applications or the like. Still further, it is to be understood that the application models can be employed to predict content, format work product, infer preference/policy, etc.

At 302, user action/context can be monitored. This user action/context information can be employed to select an appropriate model at 304. For example, at 302, it can be determined that a user is in the process of drafting a patent application whereas, the innovation can use this information to automatically select a model at 304 and thereafter apply that model at 306.

Continuing with this example, at 302, once it is determined that a user is drafting a patent application, a format model can be selected at 304 and applied at 306 to automatically set up format (e.g., font, margins) and sections (e.g., Background, Summary, Brief Description of the Drawings, Detailed Description). Still further, the innovation can automatically determine or infer the subject of the work product. Here, an application model can be selected at 304, for example to predict text for the Background section. In this example, it will be understood that the application model can be a wiki-style model whereas users collectively establish and refine the model. In operation, the model can be selected to predict text, for example, text for a Background section about wiki-style models generally.

Figure 4:
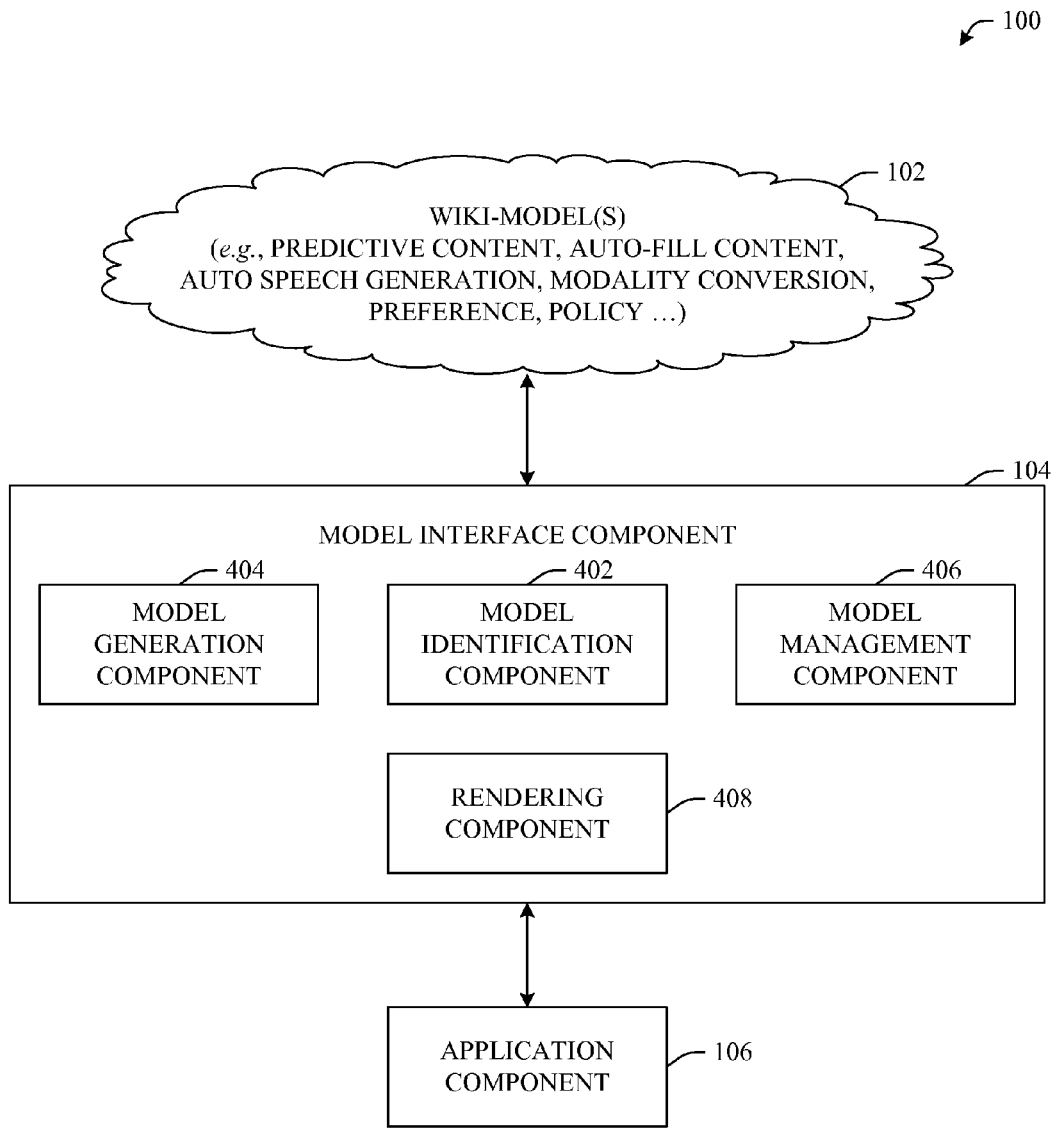
FIG. 4 illustrates an example block diagram of a model interface component that enables generation, identification and management of a wiki-type application model in accordance with aspects of the innovation.

Referring now to FIG. 4, an alternative block diagram of a system 100 is illustrated in accordance with an aspect of the innovation. More particularly, as illustrated in FIG. 4, model interface component 104 can include a model identification component 402, a model generation component 404, a model management component 406 and a rendering component 408. While all four of these sub-components (402, 404, 406, 408) are illustrated inclusive of the model interface component 104, it is to be understood that most any subset of these components can be included within a model interface component 104 in other aspects of the innovation. These sub-components are capable of effecting the features, functions and benefits of generating, maintaining, modifying and applying wiki-style application models to software applications (e.g., 106) in accordance with the innovation.

It is to be understood that the 'wiki-style' models of the innovation refer to models that can be collaboratively generated and refined by users within a defined community (e.g., all Internet users, a specific organization, a specific affiliation . . . ). Similarly, these models can also be established and/or refined for personal use rather than by a community or collaboration of users. While many of the examples refer to 'wiki-style' community models, it is to be understood that most any defined set of users can be structured to access and/or refine the models.

In particular aspects, authorship and/or access can be limited and thereby monetized by the owner of the model(s). In other words, a user can be charged to use models in accordance with the innovation. For instance, a per use charge, subscription fee or the like can be assessed to a user in order to monetize the idea application-specific and/or topical application-specific models. Essentially, it can be possible for third party vendors to establish and/or maintain a set of models whereby use of these models generates a monetary benefit to the third-party. While these monetization aspects are beneficial, it is to be understood that they are but alternative aspects of the innovation and are not intended to limit the scope of the specification and claims appended hereto.

In a collaborative wiki-style model environment users can contribute and usually stipulate that any content they generate may be used freely, similar to open-source software. While many models can be used freely, as described above, it is to be understood that the innovation provides for authors to restrict access and similarly grant permission to users to access as well as to contribute to particular models. Still further, as described above, this feature provides for unique monetization schemes which are to be included within the scope of the innovation and claims appended hereto.

With reference again to FIG. 4, the model identification component 402 can be employed to select an appropriate application model (e.g., 102) based upon most any criteria. For instance, the component 402 can identify and select a model (e.g., 102) based upon identities, actions, context, etc. of a user (e.g., author) or associated individuals (e.g., recipient of work product). Essentially, this component 402 can employ monitoring mechanisms to gather information and thereafter analyze the information to select (or otherwise suggest) a model for use with the application component 106 within a particular scenario.

The model generation component 404 can be employed to establish (or define) models in accordance with aspects of the innovation. As will be described in greater detail below, in accordance with the innovation, models can be established by a user (explicitly) or on behalf of a user (implicitly), based upon actions, context, etc. Similarly, models can be refined in the same manner, e.g., explicitly and/or implicitly.

The model management component 406 can be employed to dynamically maintain models based upon learned knowledge or feedback. For example, if a user routinely modifies predictive text in a particular manner, the model management component 406 can be employed to automatically infer a preference and thereafter modify the model(s) accordingly.

The rendering component 408 can employ the model(s) to configure content prior to actual rendering. For example, the rendering component 408 can determine the role of a target recipient of a communication and can thereafter select a model that formats, expands, redacts or otherwise configures output based upon a policy or preference of the target recipient. Similarly, the rendering component 408 can automatically convert content based upon a target device. For instance, if a model is established in text format but, rendered in an audible format, the rendering component 408 can dynamically adapt to the modality and therefore, in this example, convert the text to speech in order to render effectively.

Figure 5:
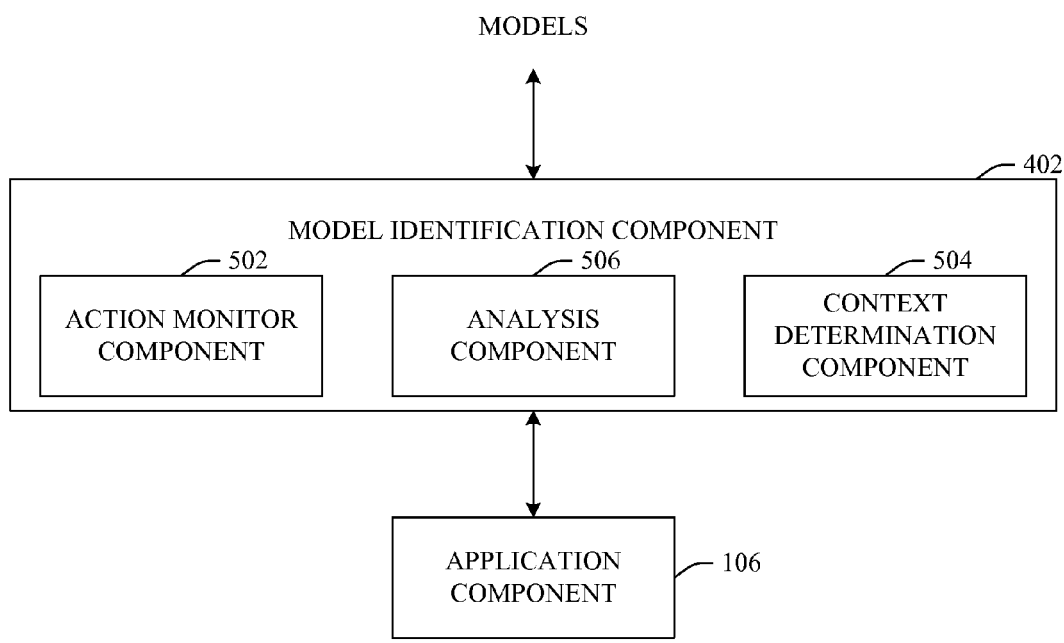
FIG. 5 illustrates an example block-diagram of a model identification component in accordance with an aspect of the innovation.

Turning now to FIG. 5, a block diagram of an example model identification component 402 is shown. Generally, the component 402 can include an action monitor component 502, a context determination component 504, and an analysis component 506—each of these sub-components will be described in greater detail below. Together, these sub-components enable application models (e.g., 102 of FIG. 1) to be identified, located and accessed for use based upon actions and/or context of a user.

The action monitor component 502 can be employed to dynamically monitor actions of a user. For instance, continuing with the above example of drafting a patent application, the action monitor component 502 can be employed to monitor user activity to thereby conclude that the user is indeed drafting a patent application. The component 502 can further monitor activity to determine specifics of the project (e.g., topic/focus, intended audience . . . ).

The context determination component 504 can similarly gather information related to the context of the author as well as intended recipients. The analysis component 506 can be used to process and further evaluate factors surrounding a project and state of the project. Thus, once factors are analyzed, the model identification component 402 can locate and access an appropriate model or set of models for use by the application component 106.

Figure 6:
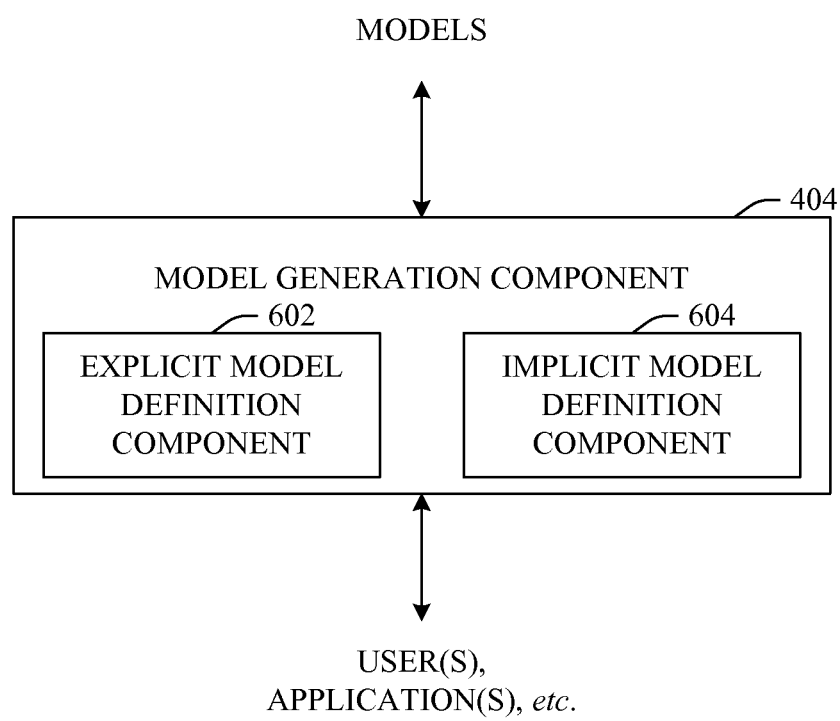
FIG. 6 illustrates an example block-diagram of a model generation component that enables explicit and/or implicit definition of a model in accordance with an aspect of the innovation.

Turning now to FIG. 6, an example block diagram of a model generation component 404 is illustrated. Generally, the model generation component 404 can include an explicit model definition component 602 and an implicit model definition component 604. Examples of each of these components (602, 604) follow, however, it is to be understood that the following examples are provided to add perspective to the innovation and are not intended to limit the innovation in any manner. Rather, it is to be understood that other examples exist which are to be included within the scope of this specification and claims appended hereto.

Referring first to the explicit model definition component 602, this component (602) enables a user (or group of users) to explicitly define an application model. For example, this component 602 enables models to be established in a similar manner of wiki-style information models. However, as described supra, the models defined and generated in accordance with the innovation enable automated (and/or dynamic) action by the application in accordance with a user (e.g., author or audience) policy, preference, action or context.

The explicit model definition component 602 can provide user interfaces, suggestions, pick-lists, wizards, etc. in order to assist a user in defining an application model. For example, in the wiki-style collaborative model generation example, here, users can access an explicit model definition component 602 to proactively define a desired model. By way of specific example, a user can generate a snippet of text, tag the text with descriptive metadata which identifies topic, subject, data type, author, etc. It will be understood that most any descriptive metadata (or tagging scheme) can be used in accordance with the innovation.

In addition to the explicit definition tools provided by the explicit model definition component 602, an implicit model definition component 604 can be employed to automatically define models based upon user actions and patterns. Here, the system can dynamically monitor user actions, preferences, patterns, habits, etc. and automatically establish models that conform to user criteria. As well, information can be gleaned or collected with regard to other aspects of user activity. For example, a pattern can be identified that relates to work product that is developed by a user in one context versus another. This information can be used to automatically establish and/or train a model accordingly.

Still further, information with regard to a target audience can be identified and thereafter used to define a model for subsequent use. It is to be understood that the implicit model definition component 604 can dynamically monitor a single user or, alternatively can monitor a group of users in order to effectively establish application models. Most any criteria or context factor can be gathered and employed to establish an application model in accordance with aspects of the innovation.

Figure 7:
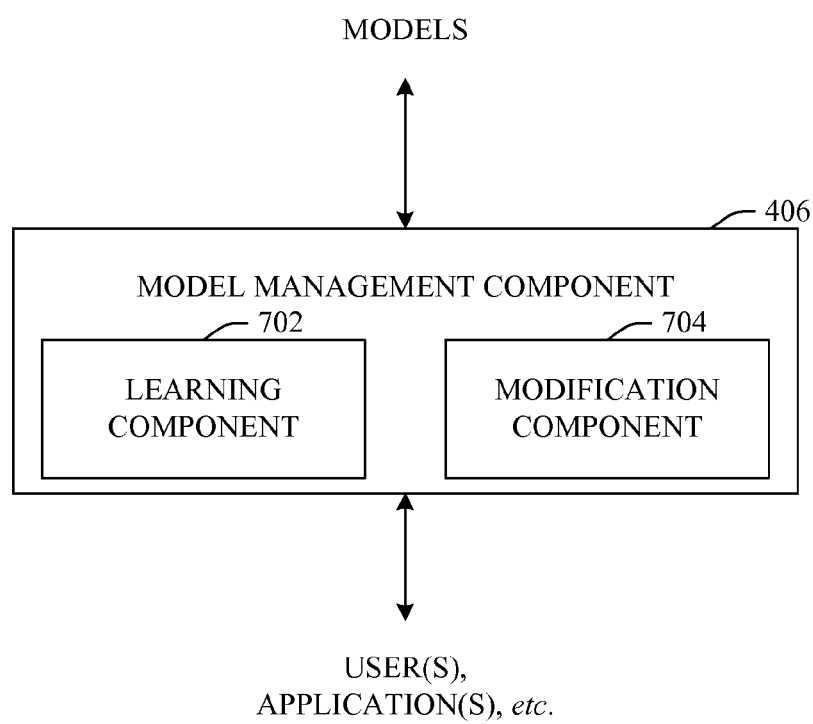
FIG. 7 illustrates an example block-diagram of a model management component that can learn and modify a model based upon user action or context in accordance with an aspect of the innovation.

Referring now to FIG. 7, an example model management component 406 is illustrated in accordance with an aspect of the innovation. Essentially, the example component 406 can include a learning component 702 and modification component 704 that together can facilitate training a particular model (or group of models) over time.

In operation, the learning component 702 is capable of obtaining feedback and utilizing the feedback to track trends and patterns related to user actions, uses of information, acceptance of proposed predictive text, etc. As such, this component (702) can enable a model to develop and 'fine tune' over time thereby enhancing usability of the model to streamline computing processes. In addition to streamlining computing processes, by tuning the model, the learning component 702 can contribute to increasing the quality of work product thereby additionally increasing computing efficiencies.

The modification component 704 can employ knowledge gained by the learning component 702 to modify (or tune) models in accordance to actual practice and/or patterns of activity. While the learning component 702 and modification component 704 are illustrate as distinct components (702, 704), it will be understood that all or a portion of the functionality of these components can be incorporated into a single component in other aspects. These alternative aspects are to be considered a part of this innovation and claims appended hereto.

Other aspects of the innovation employ machine learning and reasoning (MLR) techniques to learn, train or infer based upon activity or contextual factors. As well, MLR techniques can be employed to define or select models based upon activity, identities, context, etc. Effectively, the system can include MLR mechanisms which facilitate automating one or more features in accordance with the subject innovation.

The subject innovation (e.g., in connection with model selection or modification) can employ various MLR-based schemes for carrying out various aspects thereof. For example, a process for determining how to train a model based upon feedback can be facilitated via an automatic classifier system and process.

A classifier is a function that maps an input attribute vector, $x=(x1, x2, x3, x4, xn)$, to a confidence that the input belongs to a class, that is, $f(x)=confidence(class)$. Such classification can employ a probabilistic and/or statistical-based analysis (e.g., factoring into the analysis utilities and costs) to prognose or infer an action that a user desires to be automatically performed.

A support vector machine (SVM) is an example of a classifier that can be employed. The SVM operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated from the subject specification, the subject innovation can employ classifiers that are explicitly trained (e.g., via a generic training data) as well as implicitly trained (e.g., via observing user behavior, receiving extrinsic information). For example, SVM's are configured via a learning or training phase within a classifier constructor and feature selection module. Thus, the classifier(s) can be used to automatically learn and perform a number of functions, including but not limited to determining according to a predetermined criteria when/how to define a model, when to select a model, which model to select, when/how to refine a model, etc.

Figure 8:
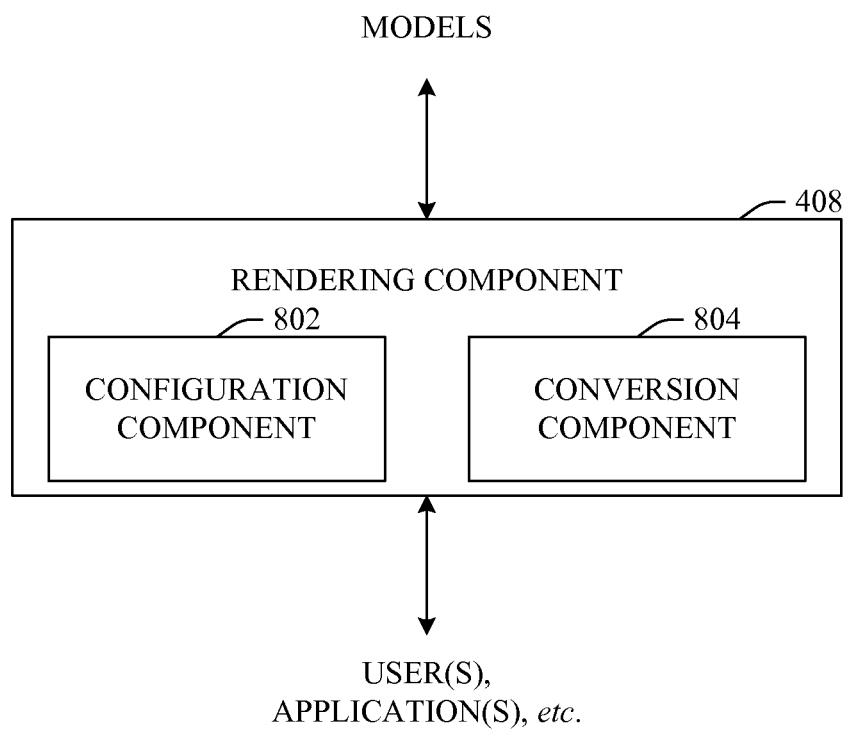
FIG. 8 illustrates a block diagram of a rendering component that employs the model to render data in accordance with aspects of the innovation.

Referring now to FIG. 8, an example block diagram of a rendering component 408 in accordance with an aspect of the innovation is shown. Generally, the rendering component 408 can include a configuration component 802 and a conversion component 804. In operation, these sub-components (802, 804) enable the system to effectively render data and information in accordance with a selected or suitable model.

Essentially, the configuration component 802 can be employed to organize, arrange or construct data and/or information into a form consistent with a selected or suitable model. Similarly, the conversion component 804 can be employed to alter or translate data into an alternative modality as required or desired. For instance, the conversion component 804 can translate data from text to speech and vice-versa as needed or desired. Moreover, as many of the models will be collaboratively defined/used throughout the world, it is possible that language or dialect conversion may also be appropriate or desired. Thus, the conversion component 804 can employ contextual factors to select (or infer) an appropriate language/dialect appropriate for translation. Thereafter, the data or information can be translated as desired.

Figure 9:
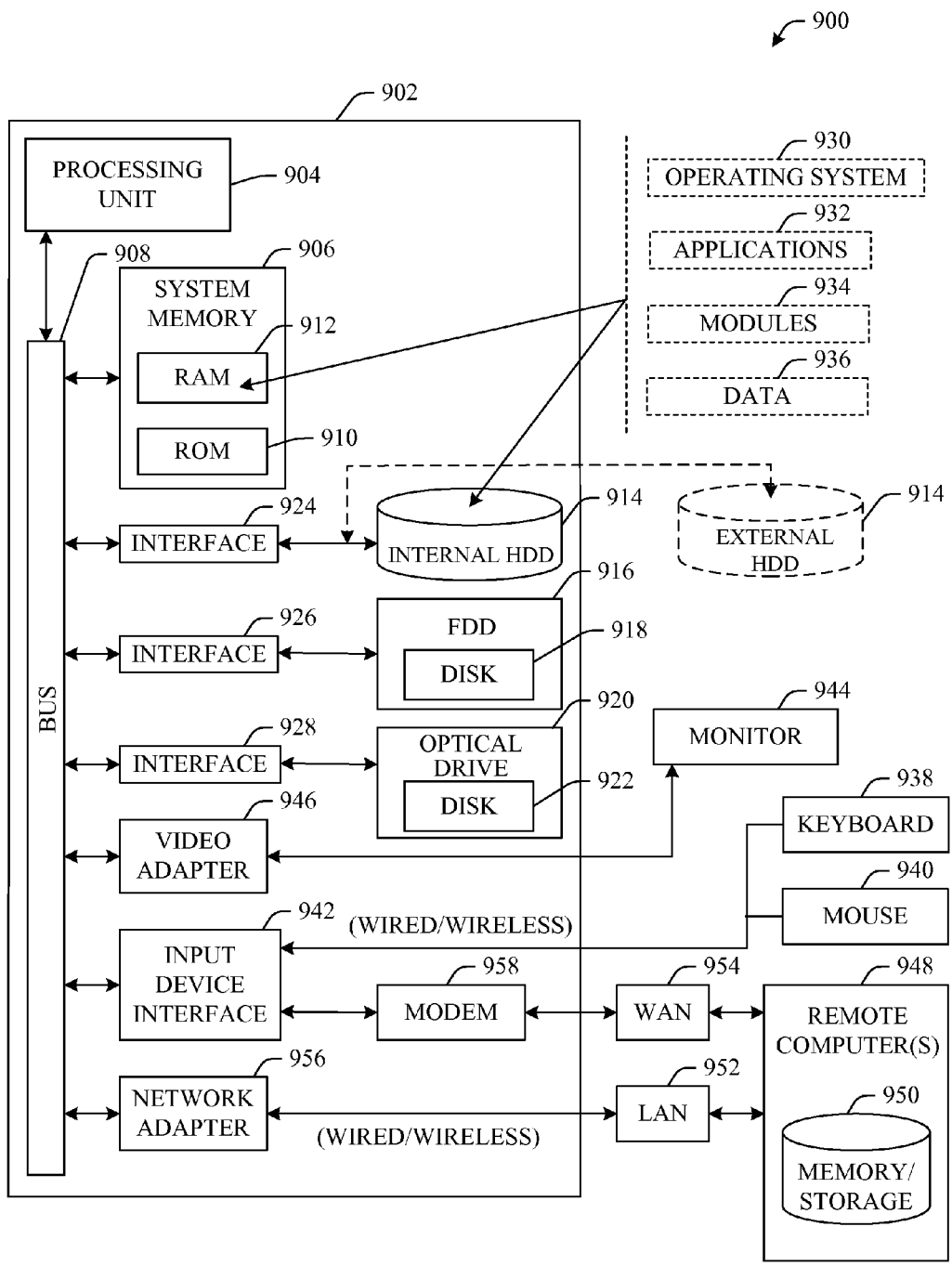
FIG. 9 illustrates a block diagram of a computer operable to execute the disclosed architecture.

Referring now to FIG. 9, there is illustrated a block diagram of a computer operable to execute the disclosed architecture. In order to provide additional context for various aspects of the subject innovation, FIG. 9 and the following discussion are intended to provide a brief, general description of a suitable computing environment 900 in which the various aspects of the innovation can be implemented. While the innovation has been described above in the general context of computer-executable instructions that may run on one or more computers, those skilled in the art will recognize that the innovation also can be implemented in combination with other program modules and/or as a combination of hardware and software. It is to be understood that the innovation is applicable to a service architecture and therefore can be implemented in a network-only (e.g., Internet) environment.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the innovation may also be practiced in distributed computing environments where certain tasks are performed by remote processing devices that are linked through a communications network. In a distributed computing environment, program modules can be located in both local and remote memory storage devices.

A computer typically includes a variety of computer-readable media. Computer-readable media can be any available media that can be accessed by the computer and includes both volatile and nonvolatile media, removable and non-removable media. By way of example, and not limitation, computer-readable media can comprise computer storage media and communication media. Computer storage media includes both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

With reference again to FIG. 9, the exemplary environment 900 for implementing various aspects of the innovation includes a computer 902, the computer 902 including a processing unit 904, a system memory 906 and a system bus 908. The system bus 908 couples system components including, but not limited to, the system memory 906 to the processing unit 904. The processing unit 904 can be any of various commercially available processors. Dual microprocessors and other multi-processor architectures may also be employed as the processing unit 904.

The system bus 908 can be any of several types of bus structure that may further interconnect to a memory bus (with or without a memory controller), a peripheral bus, and a local bus using any of a variety of commercially available bus architectures. The system memory 906 includes read-only memory (ROM) 910 and random access memory (RAM) 912. A basic input/output system (BIOS) is stored in a non-volatile memory 910 such as ROM, EPROM, EEPROM, which BIOS contains the basic routines that help to transfer information between elements within the computer 902, such as during start-up. The RAM 912 can also include a high-speed RAM such as static RAM for caching data.

The computer 902 further includes an internal hard disk drive (HDD) 914 (e.g., EIDE, SATA), which internal hard disk drive 914 may also be configured for external use in a suitable chassis (not shown), a magnetic floppy disk drive (FDD) 916, (e.g., to read from or write to a removable diskette 918) and an optical disk drive 920, (e.g., reading a CD-ROM disk 922 or, to read from or write to other high capacity optical media such as the DVD). The hard disk drive 914, magnetic disk drive 916 and optical disk drive 920 can be connected to the system bus 908 by a hard disk drive interface 924, a magnetic disk drive interface 926 and an optical drive interface 928, respectively. The interface 924 for external drive implementations includes at least one or both of Universal Serial Bus (USB) and IEEE 1394 interface technologies. Other external drive connection technologies are within contemplation of the subject innovation.

The drives and their associated computer-readable media provide nonvolatile storage of data, data structures, computer-executable instructions, and so forth. For the computer 902, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of the innovation.

A number of program modules can be stored in the drives and RAM 912, including an operating system 930, one or more application programs 932, other program modules 934 and program data 936. All or portions of the operating system, applications, modules, and/or data can also be cached in the RAM 912. It is appreciated that the innovation can be implemented with various commercially available operating systems or combinations of operating systems.

A user can enter commands and information into the computer 902 through one or more wired/wireless input devices, e.g., a keyboard 938 and a pointing device, such as a mouse 940. Other input devices (not shown) may include a microphone, an IR remote control, a joystick, a game pad, a stylus pen, touch screen, or the like. These and other input devices are often connected to the processing unit 904 through an input device interface 942 that is coupled to the system bus 908, but can be connected by other interfaces, such as a parallel port, an IEEE 1394 serial port, a game port, a USB port, an IR interface, etc.

A monitor 944 or other type of display device is also connected to the system bus 908 via an interface, such as a video adapter 946. In addition to the monitor 944, a computer typically includes other peripheral output devices (not shown), such as speakers, printers, etc.

The computer 902 may operate in a networked environment using logical connections via wired and/or wireless communications to one or more remote computers, such as a remote computer(s) 948. The remote computer(s) 948 can be a workstation, a server computer, a router, a personal computer, portable computer, microprocessor-based entertainment appliance, a peer device or other common network node, and typically includes many or all of the elements described relative to the computer 902, although, for purposes of brevity, only a memory/storage device 950 is illustrated. The logical connections depicted include wired/wireless connectivity to a local area network (LAN) 952 and/or larger networks, e.g., a wide area network (WAN) 954. Such LAN and WAN networking environments are commonplace in offices and companies, and facilitate enterprise-wide computer networks, such as intranets, all of which may connect to a global communications network, e.g., the Internet.

When used in a LAN networking environment, the computer 902 is connected to the local network 952 through a wired and/or wireless communication network interface or adapter 956. The adapter 956 may facilitate wired or wireless communication to the LAN 952, which may also include a wireless access point disposed thereon for communicating with the wireless adapter 956.

When used in a WAN networking environment, the computer 902 can include a modem 958, or is connected to a communications server on the WAN 954, or has other means for establishing communications over the WAN 954, such as by way of the Internet. The modem 958, which can be internal or external and a wired or wireless device, is connected to the system bus 908 via the serial port interface 942. In a networked environment, program modules depicted relative to the computer 902, or portions thereof, can be stored in the remote memory/storage device 950. It will be appreciated that the network connections shown are exemplary and other means of establishing a communications link between the computers can be used.

The computer 902 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

Figure 10:
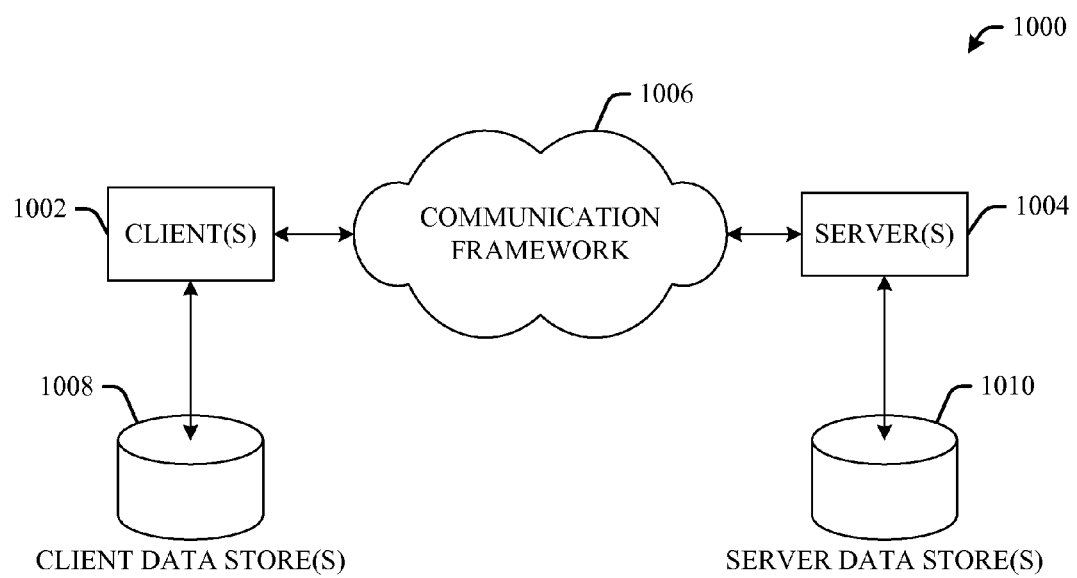
FIG. 10 illustrates a schematic block diagram of an example computing environment in accordance with the subject innovation.

Referring now to FIG. 10, there is illustrated a schematic block diagram of an exemplary computing environment 1000 in accordance with the subject innovation. The system 1000 includes one or more client(s) 1002. The client(s) 1002 can be hardware and/or software (e.g., threads, processes, computing devices). The client(s) 1002 can house cookie(s) and/or associated contextual information by employing the innovation, for example.

The system 1000 also includes one or more server(s) 1004. The server(s) 1004 can also be hardware and/or software (e.g., threads, processes, computing devices). The servers 1004 can house threads to perform transformations by employing the innovation, for example. One possible communication between a client 1002 and a server 1004 can be in the form of a data packet adapted to be transmitted between two or more computer processes. The data packet may include a cookie and/or associated contextual information, for example. The system 1000 includes a communication framework 1006 (e.g., a global communication network such as the Internet) that can be employed to facilitate communications between the client(s) 1002 and the server(s) 1004.

Communications can be facilitated via a wired (including optical fiber) and/or wireless technology. The client(s) 1002 are operatively connected to one or more client data store(s) 1008 that can be employed to store information local to the client(s) 1002 (e.g., cookie(s) and/or associated contextual information). Similarly, the server(s) 1004 are operatively connected to one or more server data store(s) 1010 that can be employed to store information local to the servers 1004.

What has been described above includes examples of the innovation. It is, of course, not possible to describe every conceivable combination of components or methodologies for purposes of describing the subject innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A computer-implemented method, comprising:
generating an application model that defines a layout for a particular document type;
monitoring a user action;
monitoring a user context; and
revising the application model based upon the user action in view of the user context.

2. The computer-implemented method of claim 1, further comprising:
obtaining feedback; and
employing the feedback to revise the model.

3. The computer-implemented method of claim 2, further comprising storing the application model for collaborative access by a plurality of users.

4. The computer-implemented method of claim 1, further comprising:
selecting the application model from a plurality of models based upon at least one of the user action or context; and
applying the selected application model to information within an application, wherein the application is at least one of a word processor, spreadsheet, presentation or communication application.

5. One or more computer storage media having stored thereon computer-executable instructions that, when executed by one or more processors, direct the one or more processors to perform actions comprising:
generating an application model that defines a layout for a particular document type;
incorporating one or more contextual factors into the application model to define one or more criterion upon which the application model is applicable, the one or more contextual factors including a user identity;
monitoring a user action;
monitoring a user context; and
revising the application model based upon the user action in view of the user context.

6. The one or more computer storage media of claim 5, wherein the one or more contextual factors further includes at least one of following:
a user role;
a user location;
a time of day; and
an engaged avidity.

7. The one or more computer storage media of claim 5, wherein the actions further comprise obtaining feedback, wherein the feedback is employed to revise the model.

8. The one or more computer storage media of claim 5, wherein the actions further comprise storing the application model for collaborative access by a plurality of users.

9. The one or more computer storage media of claim 5, wherein the actions further comprise:
selecting the application model from a plurality of models based upon at least one of the user action or context; and
applying the selected application model to information within an application, wherein the application is at least one of a word processor, spreadsheet, presentation or communication application.

10. The method of claim 1, further comprising incorporating one or more contextual factors into the application model to define one or more criterion upon which the application model is applicable.

11. The method of claim 10, wherein the one or more contextual factors includes a user identity.

12. The method of claim 11, wherein the one or more contextual factors further includes at least one of:
a user role;
a user location;
a time of day; or
an engaged activity.

* * * * *